United States Patent
Chiang et al.

(10) Patent No.: US 8,283,264 B2
(45) Date of Patent: Oct. 9, 2012

(54) METHOD AND SYSTEM FOR ISOLATED AND DISCRETIZED PROCESS SEQUENCE INTEGRATION

(75) Inventors: Tony P. Chiang, Campbell, CA (US); Richard Endo, San Carlos, CA (US); James Tsung, Milpitas, CA (US)

(73) Assignee: Intermolecular, Inc., San Jose, CA (US)

(*) Notice: Subject to any disclaimer, the term of this patent is extended or adjusted under 35 U.S.C. 154(b) by 0 days.

(21) Appl. No.: 12/954,328

(22) Filed: Nov. 24, 2010

(65) Prior Publication Data

US 2011/0065284 A1    Mar. 17, 2011

Related U.S. Application Data

(63) Continuation of application No. 11/672,478, filed on Feb. 7, 2007, now Pat. No. 7,867,904.

(51) Int. Cl.
*H01L 21/31* (2006.01)
*H01L 21/469* (2006.01)

(52) U.S. Cl. .............. 438/761; 257/E21.211; 427/282

(58) Field of Classification Search .......... 257/E21.679, 257/E21.479, E21.486, E21.211; 506/43, 506/23, 25, 22; 204/298.11, 298.1; 427/255.7, 427/282; 438/679, 75, 677, 393, 329, 761
See application file for complete search history.

(56) References Cited

U.S. PATENT DOCUMENTS

| | | | |
|---|---|---|---|
| 6,996,550 B2* | 2/2006 | Wang et al. | 706/19 |
| 7,767,627 B1* | 8/2010 | Goldwasser et al. | 506/22 |
| 2005/0150760 A1* | 7/2005 | He et al. | 204/298.26 |

* cited by examiner

*Primary Examiner* — Caridad Everhart

(57) ABSTRACT

A system for processing a semiconductor substrate is provided. The system includes a mainframe having a plurality of modules attached thereto. The modules include processing modules, storage modules, and transport mechanisms. The processing modules may include combinatorial processing modules and conventional processing modules, such as surface preparation, thermal treatment, etch and deposition modules. In one embodiment, at least one of the modules stores multiple masks. The multiple masks enable in-situ variation of spatial location and geometry across a sequence of processes and/or multiple layers of a substrate to be processed in another one of the modules. A method for processing a substrate is also provided.

7 Claims, 8 Drawing Sheets

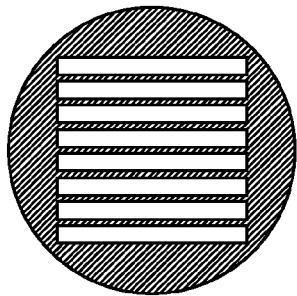 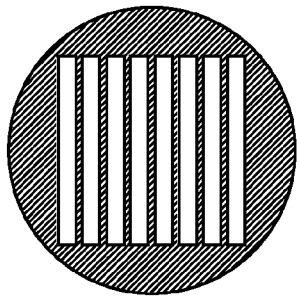 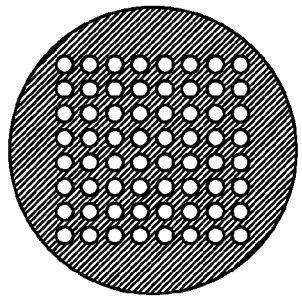
Fig. 5A-1    Fig. 5A-2    Fig. 5A-3
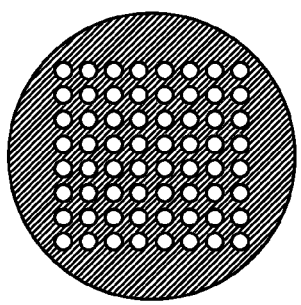 + 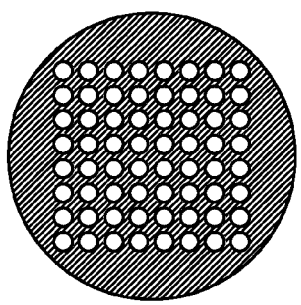 + 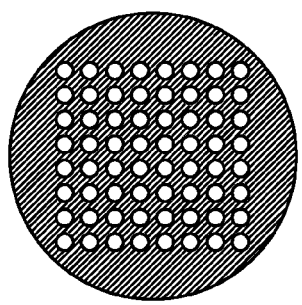
Fig. 5B-1    Fig. 5B-2    Fig. 5B-3
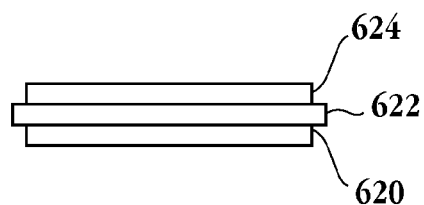
Fig. 5C

METHOD AND SYSTEM FOR ISOLATED AND DISCRETIZED PROCESS SEQUENCE INTEGRATION

CLAIM OF PRIORITY

This application claims the benefit of U.S. application Ser. No. 60/832,248 filed Jul. 19, 2006, which is incorporated by reference in its entirely for all purposes. This application claims the benefit of U.S. application Ser. No. 11/672,478 filed Feb. 7, 2007, which is incorporated by reference in its entirely for all purposes.

BACKGROUND

As semiconductor manufacturing processes become more complex, the search for improvements becomes harder to manage. Not only are different materials capable of being looked into, but processes and process sequences may also need to be modified along with the materials. In order to manage the evaluation of these variables, an inordinate amount of tests must be performed and data evaluated. The current techniques for gradient variation to evaluate materials are not optimized for efficiently performing the vast amount of tests needed. One limitation of the gradient variation technique is the inability to accommodate variation across multiple steps so that process sequences may be evaluated in combination with material evaluation. For example, the current gradient variation techniques lack the capability of evaluating different processes and process sequences contemporaneously with different materials on a single substrate.

Thus, improved techniques and related systems for testing processes, process sequences, and materials on a single substrate are needed.

SUMMARY

Embodiments of the present invention provide a method and a system for processing a semiconductor substrate. Several inventive embodiments of the present invention are described below.

In one aspect of the invention, a system for processing a semiconductor substrate is provided. The system includes a mainframe having a plurality of modules attached thereto. The modules include processing modules, storage modules, and transport mechanisms. The processing modules may include combinatorial processing modules and conventional processing modules, such as surface preparation, thermal treatment, etch and deposition modules. In one embodiment, at least one of the modules stores multiple masks. The multiple masks enable in-situ variation of spatial location and geometry across a sequence of processes and/or multiple layers of a substrate to be processed in another one of the modules. It should be appreciated that each process need not form a layer and each process does not necessarily overlap in spatial location for all regions. In another embodiment, the system includes a processing module configured to process site isolated regions of a first level of a substrate surface and change feature sizes across multiple levels disposed over each other on the substrate surface while maintaining a controlled environment. In this embodiment, the controlled environment is maintained within a frame area enclosing the plurality of processing modules.

In another aspect of the invention, a method for processing a substrate is provided. The method initiates with receiving the substrate. Multiple regions of the substrate are processed in a combination of serial manners and parallel manners while spatially varying a mask between the successive processing, wherein the successive processing occurs within the cluster tool thereby avoiding a negative environment. The negative environment avoided may include air, moisture and particulate contaminants. In one embodiment, the successive processing occurs without incurring a vacuum break. In another embodiment, a method for processing a substrate in a cluster tool without breaking vacuum is provided. The method initiates with processing the substrate in a chamber with a mask having a first feature set. Then, the substrate is processed in the chamber with a mask having a second feature set. In one embodiment, a mask with a first feature set is used for the initial processing operation and then the mask is removed from the chamber and replaced with a mask having the second feature set. In another embodiment, a method for combinatorial processing of a substrate is provided. The method initiates with processing the substrate in a conventional manner. A first site-isolated deposition over a discrete region of the substrate is performed under vacuum. A second site-isolated deposition over the discrete region of the substrate is performed without breaking vacuum. The second site-isolated deposition covers an area that is larger than the area covered by the first site isolated deposition. A third site-isolated deposition over the discrete region of the substrate without breaking vacuum is then performed. The third site-isolated deposition covers an area that is smaller than the area covered by the second site isolated deposition. This embodiment provides an example where the size relationship between the site isolated deposition regions is specified as the second site isolated region covers an area that is larger than the first region and the third site isolated region covers an area that is smaller than the second region. However, in alternative embodiments the second site isolated region is of a different size than the first site isolated region or the first, second, and third site isolated regions are all different sizes. It should be noted that site isolated regions may have different geometries and/or sizes.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 5A-1-5A-3 and 5B-1-5B-3 illustrate exemplary mask patterns that may be stored within the library modules of FIG. 4.

FIG. 5C is a simplified schematic diagram of a feature capable of being defined during site isolation processing where the feature has variable spatial definition across multiple layers of the substrate in accordance with one embodiment of the invention.

DETAILED DESCRIPTION

Figure 1:
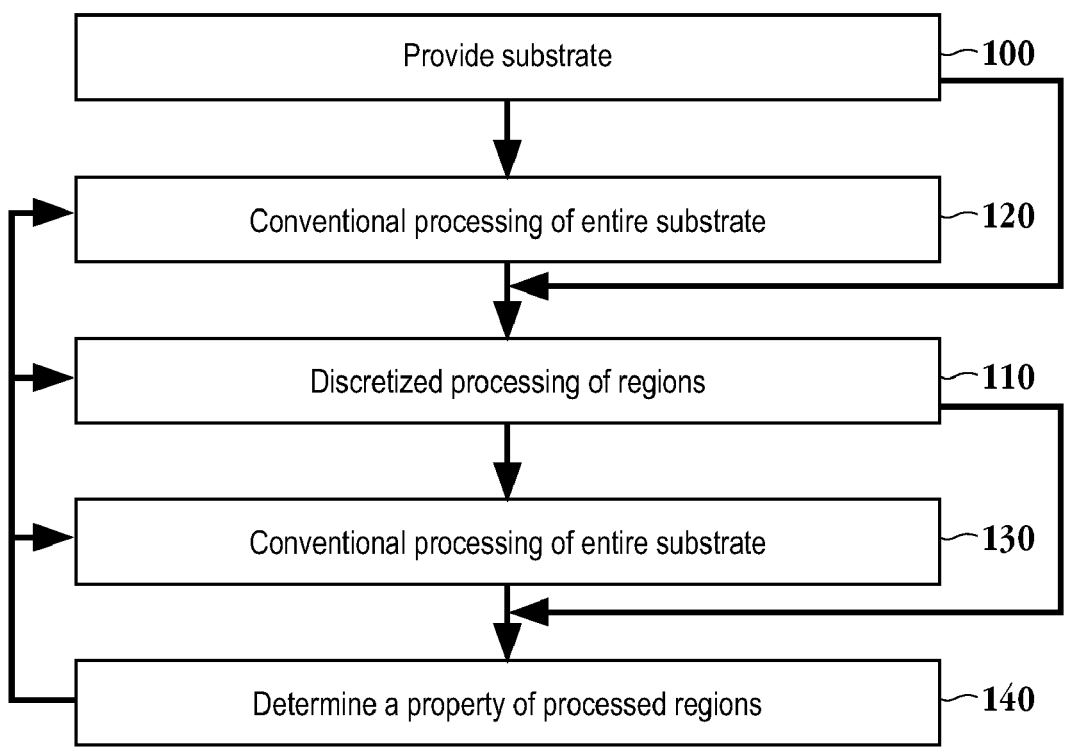
FIG. 1 is a flow chart diagram illustrating methodology for combinatorial process sequence integration in accordance with one embodiment of the invention.

The embodiments described herein provide a method and system having the capability of performing conventional and combinatorial processing that can be used to evaluate multiple materials and multiple process steps on a single substrate. It will be obvious, however, to one skilled in the art, that the present invention may be practiced without some or all of these specific details. In other instances, well known process operations have not been described in detail in order not to unnecessarily obscure the present invention.

The tools described herein may be utilized in order to analyze processes, process sequences, as well as materials in a combinatorial manner over a single substrate. The embodiments described herein enable spatial definition of desired materials and processes with variable geometry within a given processing layer and their sequencing across multiple processing layers of a given substrate without exposure of the substrate to a deleterious environment during or between such processing. In one embodiment, the avoidance of a deleterious environment is achieved by not breaking vacuum, i.e., the environment that the substrate is exposed to remains under controlled environmental conditions that includes maintaining a vacuum state. Of course, the maintenance of a vacuum state includes the condition where the vacuum may vary, but the vacuum is not broken, i.e., the pressure does not transition from a vacuum state to a positive pressure such as might be evident in the room containing the cluster tool. In this fashion, combinatorial process sequence integration can be used to optimize a semiconductor manufacturing process. The process sequence integration allows distinct processes and accompanying materials to be evaluated as opposed to solely material evaluation. As discussed in more detail below, a cluster tool having a plurality of modules where one of the modules is a combinatorial processing chamber configured to perform site isolated processing steps is provided. The site isolated processing may be performed in a serial manner where one site of a substrate is processed at a time. In another embodiment, one or more group(s) of sites on the substrate may be processed in a parallel manner. Each such group of sites can, in turn, be serially processed, i.e., in a sequential manner Furthermore, a conventional processing module, e.g., a deposition chamber, may be included in the cluster tool where all or substantially all of a substrate is processed in parallel, which may be referred to as processing in a conventional manner in some embodiments described herein. When the combined capabilities of the combinatorial and conventional processing modules are considered, any number of combinations/permutations of process materials, processes, and/or process sequences may be evaluated. Furthermore, regions of the substrate may be processed serially, in parallel, or some combination of serial processing and parallel processing within a given substrate layer or between substrate layers. Thus, the order of the processing operations, as well as the material combinations, is capable of being evaluated under the embodiments described herein.

The tools described herein also avoid exposure of the substrate to a negative environment. A negative environment may include air, oxygen, moisture, particulate contamination, etc. Basically, any environmental condition that adversely affects the process or materials in the processing operation may be considered a component of a negative environment. By controlling the environment and processing conditions within the chambers and modules, and outside of the chambers and modules but inside the cluster tool frame environment, the process sequence integration may be evaluated along with different materials. In one embodiment, the frame environment, which may also be referred to as a frame area environment, is maintained under vacuum conditions so that a vacuum break is avoided when switching masks of a processing chamber or transferring a substrate between the chambers. In addition, the embodiments include the ability to test the structure being built in-situ after each processing step. Thus, the impact of different materials used for the structure and/or the sequence of steps to build the structure can be evaluated to determine an optimum process and structure. In other words, the embodiments below describe a system and method that enables consideration of, or combination of, a process integration library with a material library. The embodiments avoid a vacuum break between steps and accommodate the geometry necessary to vary between process operations. The varying geometry includes but is not limited to varying feature size, shape, location, distribution, orientation, number, etc., between or within the steps. The controlled environment inside and outside the process modules avoids any exposure to a negative environment.

FIG. 1 is a flow chart diagram illustrating a methodology for combinatorial process sequence integration in accordance with one embodiment of the invention. In operation 100, a substrate is provided. The substrate from operation 100 may be processed in a conventional manner as specified in operation 120 or may be processed in a discretized manner as specified in operation 110. The discretized processing occurs through a high productivity combinatorial (HPC) deposition system described in further detail with reference to FIGS. 2 and 3 in accordance with one embodiment of the invention. The substrate processed in the aforementioned combinatorial fashion can optionally be previously processed in a conventional manner as illustrated in operation 120 or subsequently processed in a conventional manner as illustrated in operation 130. In addition, it should be noted that multiple discretized processing operations may occur subsequent to or prior to any conventional processing operations. One skilled in the art will appreciate that conventional processing operations refer to process operations where a substrate or substantial portion of the substrate is processed in a uniform manner, such as is performed through commercially available deposition, etch, cleaning, and other semiconductor processing tools used in the manufacturing of semiconductor chips. Thus, the operations described herein enable combinatorial processing and combinatorial process sequence integration approaches to be employed in desired segments of the process flow required to build an end device, e.g., an integrated circuit, etc. The process regions such as devices or portions of devices created can then be tested for a property of interest using conventional methods for analysis as specified in operation 140. It should be appreciated that the testing process of operation 140 can occur at numerous steps within the flow chart of FIG. 1. That is, after each conventional processing technique and/or each discretized processing technique, testing can occur in order to gather information on the individual process sequences and the sequence integration. In addition, testing may occur after a sequence of processes. The testing occurs in-situ in one embodiment. Of course, testing is optional between each of the operations of FIG. 1 and may or may not take place. As will be appreciated throughout the description of the embodiments, many alternative combinations/permutations are achievable through the design/system described herein. Thus, exemplary embodiments specifically mentioned are not meant to be limiting.

Figure 2:
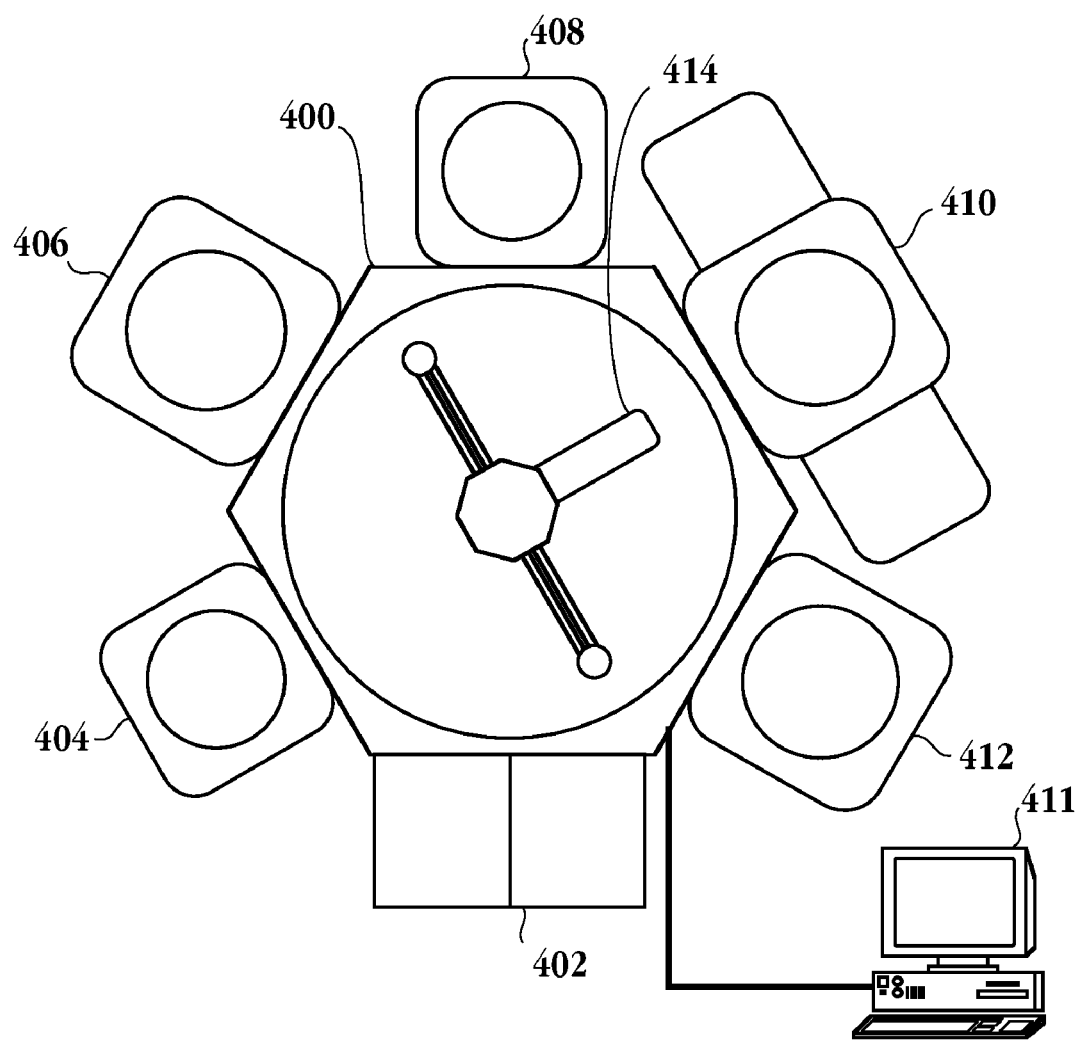
FIG. 2 is a simplified schematic diagram illustrating an integrated high productivity combinatorial (HPC) deposition system in accordance with one embodiment of the invention.

FIG. 2 is a simplified schematic diagram illustrating an integrated high productivity combinatorial (HPC) deposition system in accordance with one embodiment of the invention. HPC deposition system includes a frame 400 supporting a plurality of processing modules. It should be appreciated that frame 400 may be a unitary frame in accordance with one embodiment. However, any suitable structure configured to support the modules described herein and allow for the transportation of substrates between the plurality of modules may be utilized with the embodiments described herein. For example, frame 400 may be a plurality of separate pieces integrated together. Load lock/factory interface 402 provides access into the plurality of modules of the HPC deposition system. In accordance with one embodiment, load lock/factory interface 402 may include a FOUP. Robot 414 provides for the movement of substrates (and masks) between the modules and for the movement into and out of the load lock 402. Module 404 may be an orientation/degassing module in accordance with one embodiment. That is, module 404 may align a substrate in one embodiment. It should be appreciated that through notches or other markings on the substrate, module 404 may perform this alignment function in order to consistently place a substrate in the plurality of modules. In addition, module 404 may serve as a degas module where before (or after) any processing, such as the deposition processes described herein, the substrate may degas in module 404. Module 406 may be a clean module in accordance with one embodiment of the invention. The cleaning performed by module 406 may be a plasma based or a non-plasma based process. In one embodiment the cleaning can be a vapor based process. The cleaning may be a dry process, but is not limited to dry cleaning processes, as wet cleaning processes used in semiconductor processing may also be incorporated. Any of the known cleaning processes commonly used in semiconductor manufacturing operations may be performed in module 406. For example, an argon containing sputter clean or a hydrogen containing reactive clean can take place through module 406. Module 408 is referred to as a library module in accordance with one embodiment of the invention. In module 408, a plurality of masks, also referred to as processing masks, are stored. The masks may be used in the combinatorial processing modules in order to apply a certain pattern to a substrate being processed in those modules. Further details of the library module 408 are provided with reference to FIG. 4. It should be appreciated that library module 408 and the masks contained therein enable the features to spatially vary across layers of substrates being processed. Furthermore, the site isolation processing is capable of being performed with spatial definition across multiple layers without incurring a vacuum break during the processing in the high productivity combinatorial (HPC) deposition system described herein. The capability of spatially varying the feature sets through the different masks, in conjunction with the controlled environment processing of the HPC deposition module, offers a powerful tool for evaluating various material components independently or contemporaneously with various process sequences. In other words, module 408, in combination with a HPC module enables the evaluation and coupling of process sequences along with the materials and process libraries.

Module 410 includes a HPC physical vapor deposition module in accordance with one embodiment of the invention. Module 410 includes shutter garages 410a and 410b. Moveable shutters within shutter garages 410a and 410b can move in a planar direction in order to partially block off a mask supplied to module 410 from module 408. That is, a mask from library module 408 is supplied to module 410 by robot 414. Shutter garages 410a and 410b include shutters that are capable of moving in a planar direction to cover a portion of the mask provided to module 410. Of course, the entire process mask may be exposed. The function of the shutter garages 410a and 410b is further described in more detail with regard to FIGS. 5 through 7. It should be appreciated that the shutters can enable gradient processing or can be used to alter the exposure patterns during processing. Furthermore, when combined with the ability to spatially vary features enabled through library module 408, a highly flexible combinatorial/non-combinatorial process integration tool is provided.

In one embodiment, HPC module 410 is capable of executing techniques, methodologies, processes, test vehicles, synthetic procedures, technology, or combinations thereof used for the simultaneous, parallel, or rapid serial: (i) design, (ii) synthesis, (iii) processing, (iv) process sequencing, (v) process integration, (vi) device integration, (vii) analysis, or (viii) characterization of more than two (2) compounds, compositions, mixtures, processes, or synthesis conditions, or the structures derived from such. It should be appreciated that test vehicles include, but are not limited to, physical, electrical, photolytic, and/or magnetic characterization devices such as test structures or chips, used in the design, process development, manufacturing process qualification, and manufacturing process control of integrated circuit devices.

Module 412 is a conventional deposition module in accordance with one embodiment of the invention. Module 412 may include a module configured to perform conventional physical vapor deposition (PVD), chemical vapor deposition (CVD), atomic layer deposition (ALD), plasma enhanced atomic layer deposition (PEALD), rapid thermal processing (RTP), etc., processes in accordance with one embodiment of the invention. Thus, while HPC module 410 may perform site isolated processing, module 412 will perform parallel processing across an entire substrate (e.g., wafer) under conventional techniques. It should be appreciated that while FIG. 2 illustrates a specific configuration of the modules, this configuration is not meant to be limiting. That is, any combination of modules may be incorporated in the HPC deposition system as long as a HPC deposition module, such as module 410 is included. Thus, numerous configurations of the processing system of FIG. 2 are possible. It should be noted that the functionality provided by the library module 408 may be provided through a load lock module dedicated to the storage of the process masks in one embodiment.

One skilled in the art will appreciate that a controller may control the operations and the processes referred to herein. That is, a recipe for a certain process is programmed into the memory of a controller and the controller executes the recipe by manipulating valves, power supplies, robots, and other physical devices of the modules of the cluster tool to achieve the desired functionality. The controller may be part of a computing system having a graphical user interface for viewing the process, process results of an in-situ testing, as well as modifying the recipe. The computing device will include a central processing unit (CPU), a memory, a bus for communication between the memory and the CPU, as well as input/ output capability and a display. In one embodiment, a centralized controller, i.e., computing device 411, may control the processes of the HPC system. Alternatively, each module may have a controller in communication with centralized computing device 411. Of course, controllers may be local to some modules while other modules may be controlled through centralized computing device 411.

The environment within frame 400 is controlled to provide an environment that is not deleterious to the processing operation being performed. In one embodiment, the environment may operate in a controlled inert environment. For example oxygen may be pumped out of the environment and replaced with an inert gas. Examples of gases that can be pumped in to replace oxygen may be, for example, argon, nitrogen, and other inert gasses that will not negatively react with the substrate processing operations. In this embodiment the oxygen is removed to a level sufficient to avoid any oxidation of processed substrates prior and/or between subsequent processing. In another embodiment, the environment within frame 400 is maintained at a vacuum. In this embodiment, the pressure within the module may be maintained between about 1 Torr and about $10^{-10}$ Torr. It should be appreciated that the environment may be initially pumped down to a certain vacuum level and then as process gases are injected into the respective chambers a vacuum state is maintained. Furthermore, by pumping down initially to a low pressure, such as about $10^{-6}$ to $10^{-10}$ Torr, any contaminants present are essentially removed. As the unitary mainframe is airtight in one embodiment, the environment is controlled and protected from any contaminants breaching the frame environment.

Of course, the environment may be maintained at a positive pressure in another embodiment, and it should be appreciated that the actual ranges provided are exemplary and not meant to be limiting as control of the environment is maintained according to the processing operations being performed. One skilled in the art will appreciate that numerous techniques may be utilized to control the moisture, humidity, particulate matter, temperature, pressure, and any other property of the environment so as to enable the movement of substrates and masks between modules and through the frame environment without having any deleterious effects being introduced to the substrates, masks, processes being performed on the substrates, and/or structures defined by these processes.

Figure 3:
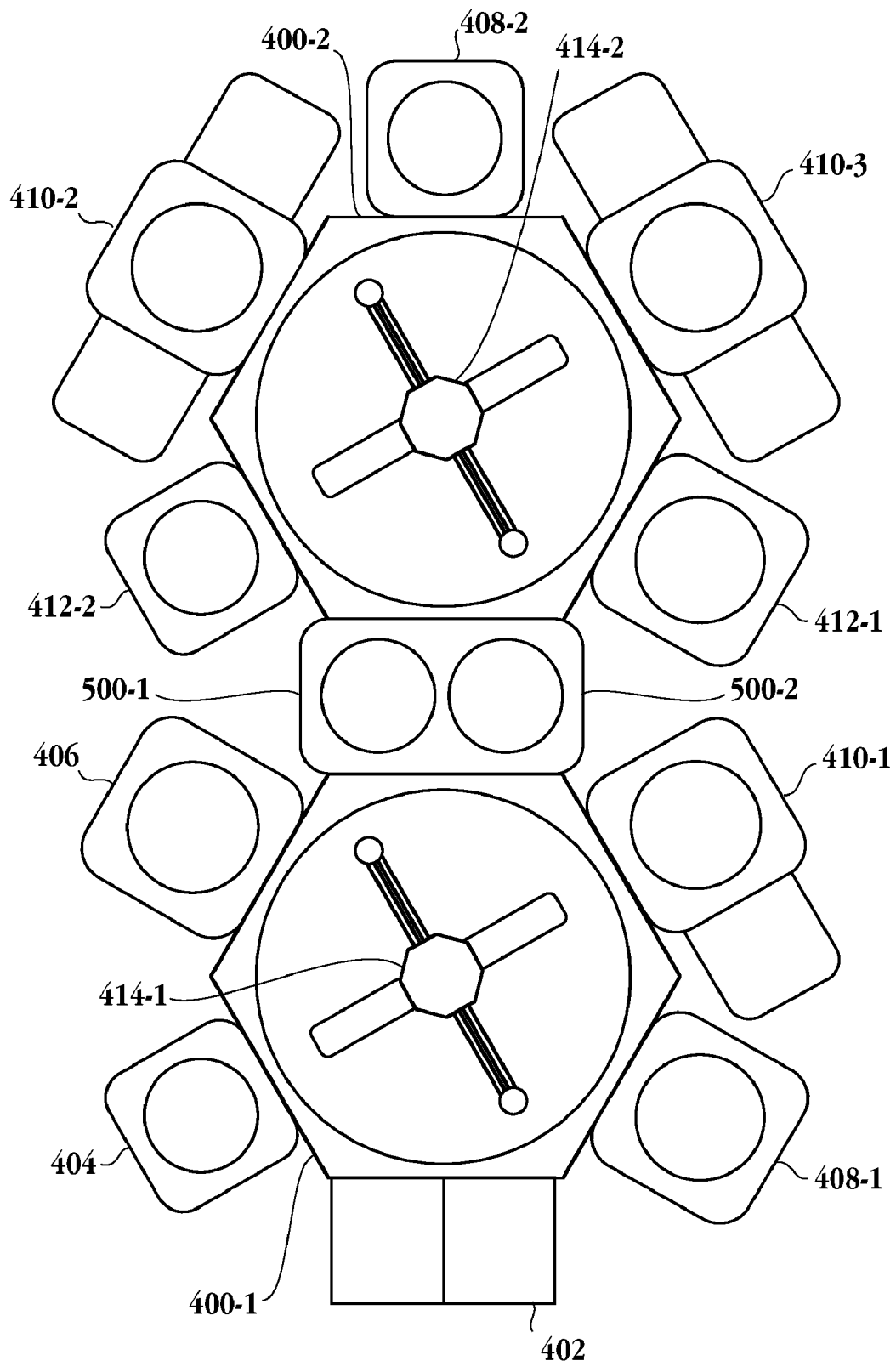
FIG. 3 is an alternative embodiment for an integrated high productivity combinatorial (HPC) deposition system illustrated in FIG. 2.

FIG. 3 is an alternative embodiment for an integrated high productivity combinatorial (HPC) deposition system illustrated in FIG. 2. In FIG. 3, two main frames 400-1 and 400-2 are coupled together (also known as a unitary cluster tool with two main modules, see, e.g., U.S. Pat. Nos. 5,186,718 and 6,977,014) in order to provide a tool having a plurality of processing modules in accordance with one embodiment of the invention. Mainframe 400-1 has clustered therearound, in one exemplary embodiment, load lock 402, an orientation/degas module 404, clean module 406, library module 408-1, and HPC module 410-1. Robot 414-1 provides for the transition and movement of substrates and/or masks between the processing modules and for ingress and egress out of the cluster tool. Modules 500-1 and 500-2 provide pass through capability between the systems associated with mainframe 400-1 and mainframe 400-2. In addition, modules 500-1 and 500-2 may provide orientation capability for substrates and/or masks being transferred between the two mainframes 400-1 and 400-2.

Mainframe 400-2 has a plurality of processing modules clustered therearound. The modules include conventional processing (e.g., deposition, surface preparation, treatment, etc.) module 412-1 and conventional processing module 412-2. HPC module 410-2 and HPC module 410-3 are also provided as processing modules. Module 408-2 is a library module holding a plurality of processing masks in accordance with one embodiment of the invention.

The conventional processing modules can include physical vapor deposition (PVD), chemical vapor deposition (CVD), plasma enhanced chemical vapor deposition (PECVD), atomic layer deposition (ALD), plasma enhanced atomic layer deposition (PEALD), ion-induced atomic layer deposition (II-ALD), radical enhanced atomic layer deposition (RE-ALD), etc. and related modules. The conventional processing modules can also include thermal, laser, UV, IR, microwave, e-beam, ion, and other forms of treatment modules known in the art.

In one embodiment, at least one of the HPC modules is configured to perform physical vapor deposition (PVD). In other embodiments, the at least one of the HPC modules is configured to perform at least one of chemical vapor deposition (CVD), plasma enhanced chemical vapor deposition (PECVD), atomic layer deposition (ALD), atomic layer deposition (PEALD), ion-induced atomic layer deposition (II-ALD), radical enhanced atomic layer deposition (RE-ALD), thermal treatment, laser treatment, UV treatment, IR treatment, microwave treatment, e-beam treatment, and ion treatment.

FIG. 3 is provided to show an alternative embodiment in which a plurality of main frames are integrated in order to provide for further processing combinations and permutations. It should be appreciated that any number of main frames may be integrated together in order to provide additional processing modules to support a varied amount of processing operations. Within the library modules 408-1 and 408-2, the masks provided therein enable the accommodation of different geometries so that features may be defined across layers during the processing of substrates without the need for a vacuum break. Alternatively, one library module could provide mask sets to the entire deposition system with the use of modules 500-1 and 500-2 as pass through chambers. Thus, the embodiments described herein not only allow for multiple materials to be tested but the sequence of steps, i.e., process sequence, may also be included in the testing matrix. That is, the system described herein allows for combinatorial processing and non-combinatorial processing across layers of a substrate so that not only different materials may be incorporated and evaluated, but also the processes and process sequence may be modified in order to determine an optimum process sequence. The process sequence may include the order of processing steps and the corresponding operating conditions for those steps, e.g., temperature, pressure, gas flow, gas species, gas ratios, power, time, duty cycle, frequency, etc. as is the case for physical vapor deposition (PVD) and any other processing parameter associated with semiconductor processing operations. It should be appreciated that the masks provided by library modules 408-1 and 408-2 may be oriented within the library modules themselves, or within orientation modules 500-1 or 500-2. Again, FIG. 3 is one exemplary figure of numerous configurations offered through the combination of modules of the embodiments described herein.

Figure 4:
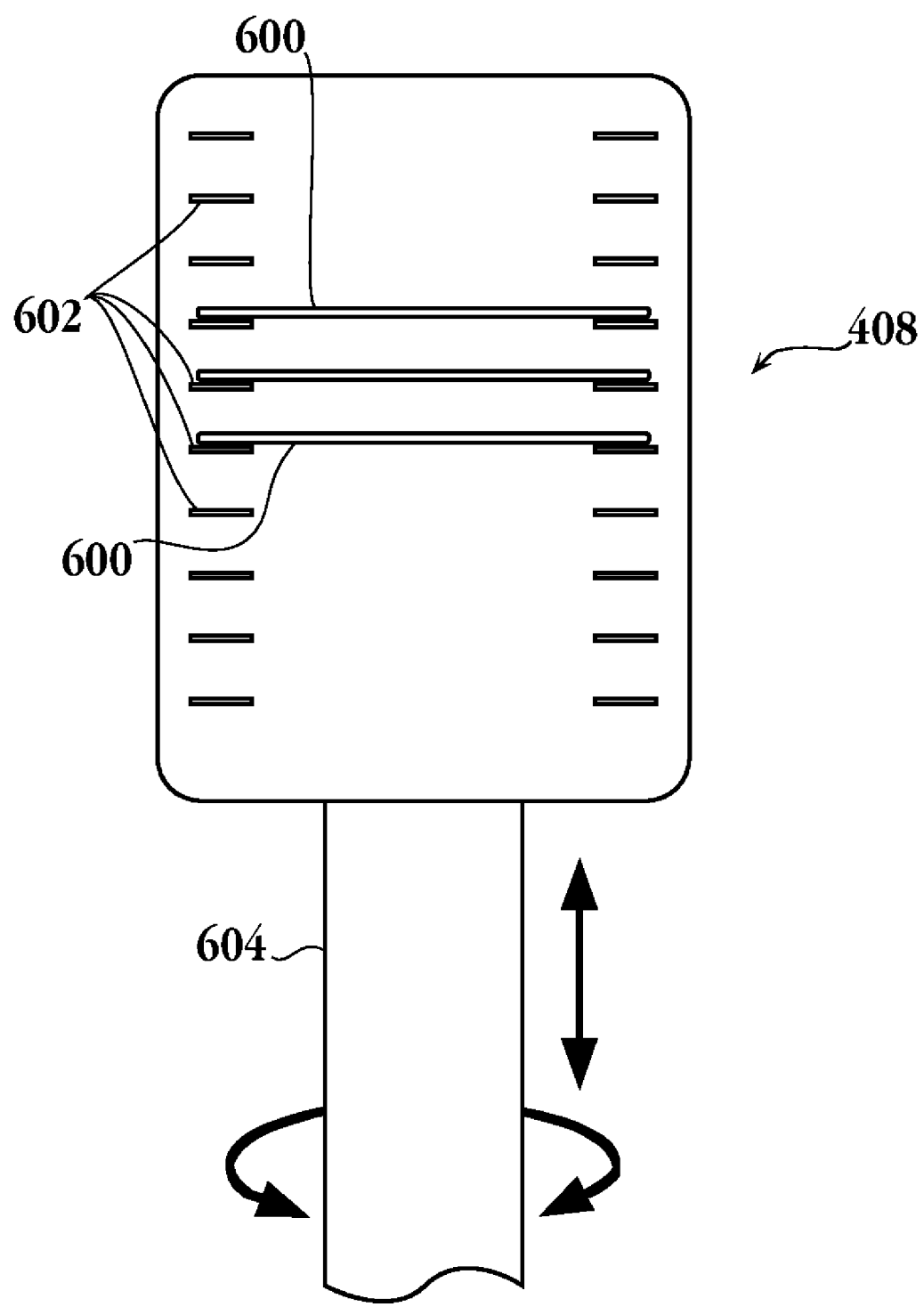
FIG. 4 is a simplified schematic diagram illustrating the library module in accordance with one embodiment of the invention.

FIG. 4 is a simplified schematic diagram illustrating the library module in accordance with one embodiment of the invention. Library module 408 includes a plurality of masks 600 stored therein. Masks 600 may rest on corresponding shelves 602 in accordance with one embodiment of the invention. However, masks 600 may rest on numerous other structures configured to support the mask within the library module in accordance with one embodiment of the invention. That is, the masks may rest on any suitable structure that enables a robot to access masks 600. Of course, the structure is suitable for a clean environment and is compatible with the mask material. Module 408 is capable of rotational movement and vertical movement in accordance with one embodiment of the invention. One skilled in the art will appreciate that any suitable motor can provide the vertical height control as well as the rotation around shaft 604. Masks 600 stored in library module 408 are moved into and out of modules, such as the combinatorial processing module. Masks 600 have various pattern and feature sizes included thereon, e.g., as illustrated in FIGS. 5A-1-5A-3 and 5B-1-5B-3. As stated above, a load lock module may substitute as a library module in one embodiment.

FIGS. 5A-1-5A-3 and 5B-1-5B-3 illustrate exemplary mask patterns that may be stored within the library modules of FIG. 4. It should be appreciated that the mask patterns shown are exemplary and not meant to be limiting as any number of different mask patterns varying in geometrical and/or feature size capability may be employed depending on the process requirements. Mask patterns may include, but are not limited to, variations in a number of openings, opening size, opening shape, opening orientation, opening location, and opening distribution, etc.

In FIG. 5A-1, a mask pattern having a number of rows is provided. The pattern for FIG. 5A-2 includes a pattern having a number of columns across a substrate. The pattern of FIG. 5A-3 includes a number of circles throughout the mask. In addition, it should be appreciated that manipulation of the shutters in the shutter garage mentioned above may be used to expose a portion of the mask illustrated if FIG. 5A-1 through 5A-3. For example, with regard to FIG. 5A-3, a shutter may block a portion of the circles so that the mask may be modifiable through the shutter position. It should be appreciated that numerous other patterns and shapes/geometries are capable of being captured on a mask, and the three patterns illustrated in FIGS. 5A-1 through 5A-3 are exemplary and not meant to be limiting. In one embodiment, the pattern of a feature on a single mask may vary in size on different portions of the mask.

FIGS. 5B-1 through 5B-3 illustrate a combination of transferable masks in accordance with one embodiment of the invention. In FIGS. 5B-1 through 5B-3, a metal mask is initially used to define the first metal layer 620 of FIG. 5C. The insulator mask of FIG. 5B-2 is then used to define the insulator layer 622 of FIG. 5C. Finally the metal mask of FIG. 5B-3 is used to define the top metal layer 624 of FIG. 5C. This results in the pattern across layers of the substrate being processed as illustrated in FIG. 5C to define a functional metal-insulator-metal capacitor structure. It should be appreciated that by employing the transferable masks, the insulator area of layer 622 is made larger relative to the metal 1 area of layer 620 and the metal 2 area of layer 624 is made smaller relative to the insulator area of layer 622 in order to guarantee that there is proper electrical isolation between the metal 1 and metal 2 areas.

FIG. 5C is a simplified schematic diagram of a feature capable of being defined during site isolation processing where the feature has variable spatial definition across multiple layers of or multiple process steps performed on the substrate in accordance with one embodiment of the invention. FIG. 5C illustrates a metal-insulator-metal structure that may function as a memory element. Metal layer 624 is disposed over insulator layer 622, which in turn is disposed over metal layer 620. As illustrated there is spatial variation provided between each of the layers (620 to 622 and 622 to 624) to provide isolation between each layer and between the top and bottom electrodes to prevent any short circuiting. One skilled in the art will appreciate that a gradient approach cannot achieve this geometry. The mask patterns of FIGS. 5B-1-5B-3 achieve the structure of FIG. 5C and the ability to move the masks into and out of the HPC module enables this processing. Furthermore, the interfaces between the structure defined by layers 620, 622, and 624 may be evaluated, as opposed to gradient techniques, where this evaluation is not possible.

As mentioned above, the masks can be moved into and out of the combinatorial module from the library module, and the environment within the frame area avoids any vacuum breaks or exposure to a negative environment so that the process sequence can be evaluated without deleterious perturbations of physical, mechanical, chemical, electrical, optical, magnetic, and/or any combinations thereof, properties of interest. The different masks within the library module and the ability to move these masks into and out of processing chambers enable variations to be introduced into the process sequence while defining actual structures of integrated circuits. That is, any semiconductor structure, such as the MIM of FIG. 6C, or a trench, via, transistor, capping layers, barrier layers, adhesion layers, etc., are achievable for evaluation. It should be appreciated that some of the variations allowed through the system having transferable masks include periodicity, feature size, feature shape, feature distribution, percent open, orientation, and/or any combinations thereof. Furthermore, the processing operations may combine combinatorial processing and conventional processing, as well as combinations of the two. For example, a single mask may be used to process a fraction of the area of the substrate in a sequential fashion. In one exemplary embodiment, one quarter regions of the substrate may be processed sequentially with the same mask. Thus, from one aspect, the four quarter regions are being processed serially, however, the sub-regions defining each quarter region are being processed in parallel.

Figure 6A:
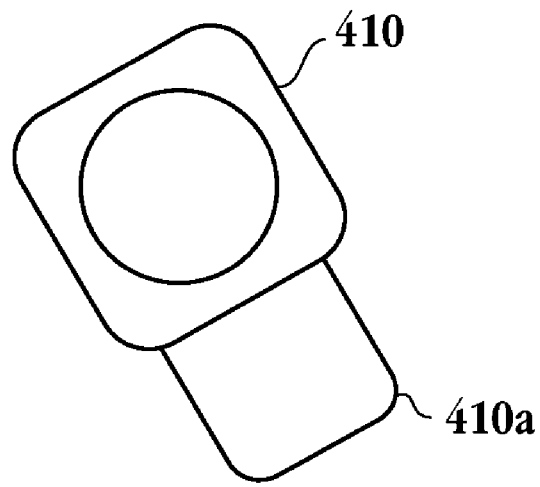
FIGS. 6A and 6B illustrate HPC modules having shutter garages in accordance with one embodiment of the invention.
Figure 6B:
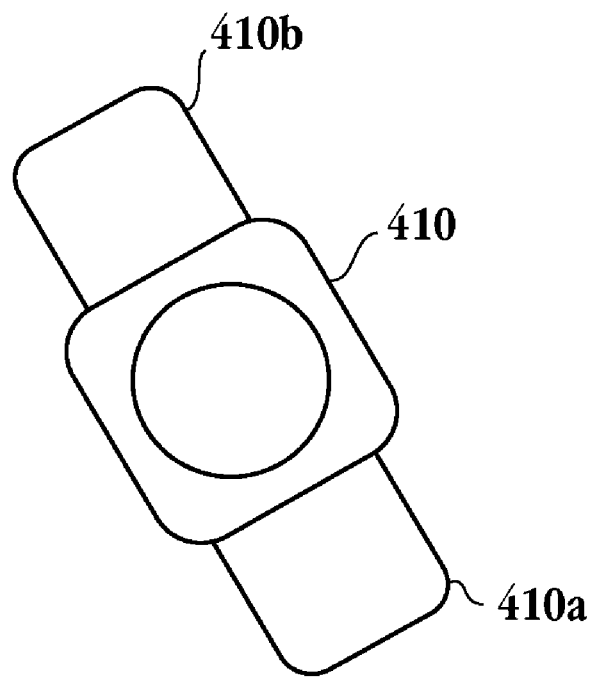

FIG. 6A and 6B illustrates HPC modules having shutter garages in accordance with one embodiment of the invention. In FIG. 6A, processing module 410 includes shutter garage 410a. Shutter garage 410a may contain a fixed or a movable shutter. That is, shutter garage 410a may be configured to hold or house a fixed shutter to block half or some other fixed portion, of a mask (or substrate) within processing module 410. Alternatively, shutter garage 410a may be configured to hold a movable shutter to block any portion or none of a mask (or substrate) within processing module 410. It should be appreciated that processing module 410 is a high productivity combinatorial deposition module described above in accordance with one embodiment of the invention. In FIG. 6A, processing module 410 has a single shutter garage 410a. Alternatively, FIG. 6B illustrates processing module 410 having a plurality of shutter garages 410a and 410b. It should be appreciated that shutter garages 410a and 410b may store fixed or movable shutters as mentioned with reference to FIG. 6A.

In addition, while the shutter garages of FIG. 6B are positioned opposing each other one shutter garage may be at a 90 degree angle relative to another shutter garage in one embodiment of the invention. Of course, the shutter garages may be disposed in any orientation or combination of orientations off of the processing module. Furthermore, fixed masks may be transferred into the HPC modules, e.g., from the library module. Alternatively, the mask can reside in the shutter garage thereby eliminating the need for a library module in one embodiment where the process allows for such. In the embodiment where the mask resides in the shutter garage, multiple patterns and geometries may be defined on the mask and through the rotation of the mask, the site isolated processing with spatial variation across layers is achievable. For example, with reference to FIGS. 5B-1-5B-3, a single mask may include half of the pattern of FIG. 5B-1 and half of the pattern of FIG. 5B-2. Then, through rotation and use of the shutters, the site isolated processing with spatial variation as embodied in FIG. 5C is achieved. Of course, the rotation of the mask may occur through the robot or a suitable mechanism disposed within the shutter garage. It should be appreciated that the substrate may be rotated or moved independent of the masks also to achieve the site isolated processing with spatial variation.

Figure 7A:
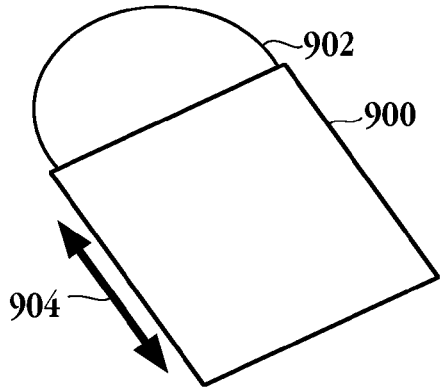
FIGS. 7A through 7D illustrate various configurations that may be applied through orientation of the shutters of the shutter garages of FIGS. 6A and 6B in accordance with one embodiment of the invention.
Figure 7B:
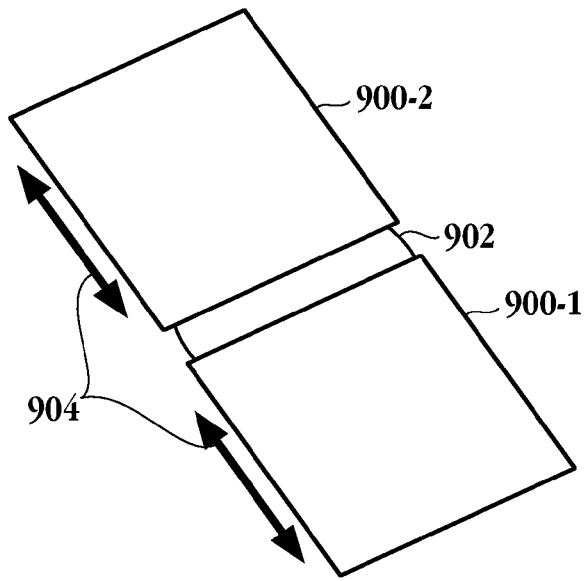

FIGS. 7A through 7D illustrate various configurations that may be applied through orientation of the shutters housed within the shutter garages of FIGS. 6A and 6B in accordance with one embodiment of the invention. In FIG. 7A movable shutter 900 is blocking a portion of substrate 902. Movable shutter 900 may move in a planar direction which is substantially parallel to the plane of substrate 902. This planar direction is illustrated by arrow 904. In FIG. 7B, two shutters are used in order to block multiple portions of substrate 902. Shutters 900-1 and 900-2 each block corresponding ends of substrate 902, thereby leaving a middle portion of substrate 902 exposed. Shutters 900-1 and 900-2 again move in a direction illustrated by arrows 904. One skilled in the art will appreciate that numerous techniques may be used to provide the movement for shutters 900-1 and 900-2. For example, one end of the shutters may be fixed to an extension arm which moves or steps a certain amount according to a controller. In another embodiment, shutters 900-1 and 900-2 may be fixed in positions.

Figure 7C:
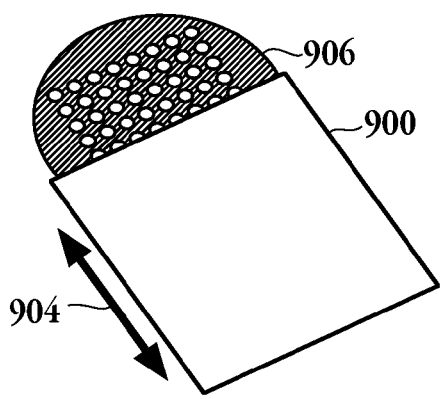
Figure 7D:
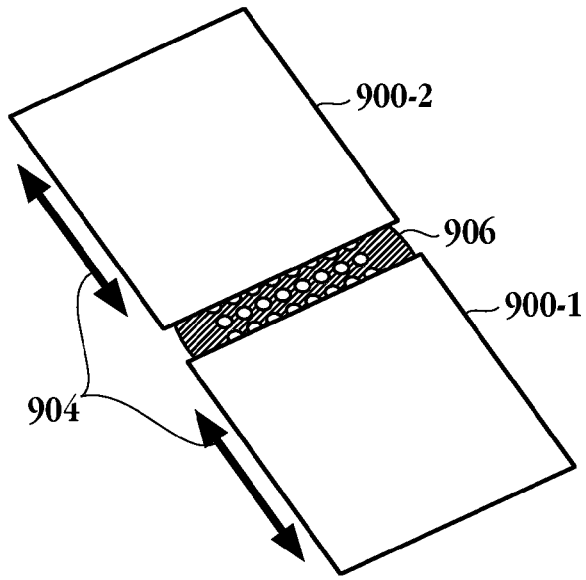

While FIGS. 7A and 7B illustrate the movement of shutters to limit exposure of a substrate, the shutters may also be used to limit the exposure of a mask disposed over a substrate. FIGS. 7C and 7D illustrate the shutter configured to block a portion of a mask disposed over a substrate. In FIG. 7C, shutter 900 blocks a portion of mask 906. Thus, a substrate disposed under mask 906 will only see the process through the exposed portion of mask 906. In FIG. 7D, shutters 900-1 and 900-2 block portions of mask 906. It should be appreciated that mask 906 may be rotated within the processing module and if the mask has various patterns defined thereon, the various patterns may be applied through rotation of the mask in accordance with one embodiment of the invention. In another embodiment, the substrate itself can be rotated by rotating for example the pedestal or substrate support on which the substrate sits.

Figure 8:
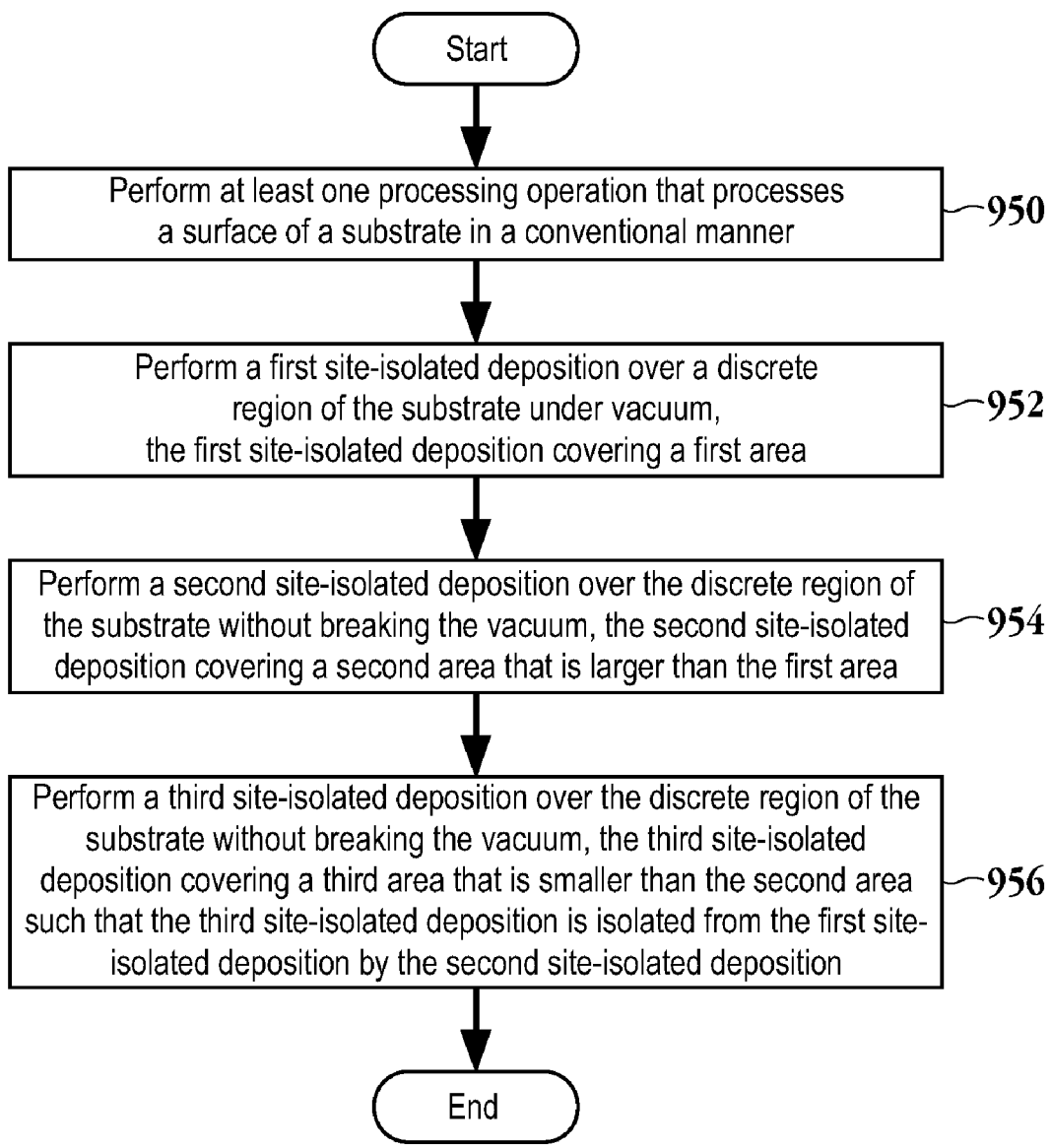
FIG. 8 is a flow chart diagram illustrating the method operations for combinatorial processing of a substrate in accordance with one embodiment of the invention.

FIG. 8 is a flow chart diagram illustrating the method operations for combinatorial processing of a substrate in accordance with one embodiment of the invention. In operation 950, a conventional processing technique such as a surface preparation, surface treatment, deposition or etch technique commonly performed on a substrate through commercially available equipment may be performed here. It should be noted that operation 950 is optional. In one embodiment, the substrate can be provided with the blanket deposition, or any other processing operation, previously performed. The method then advances to operation 952 where a first site isolated deposition over a discrete region of the substrate is performed under vacuum conditions. The first site isolated deposition covers a first area of the substrate. Here, the HPC deposition system described with regard to FIGS. 2 and 3 may achieve this site isolated processing. The method then advances to operation 954 where a second site isolated deposition is performed over a discrete region of the substrate without breaking the vacuum. The second site isolated deposition covers a second area that is larger than the first area. In operation 954, the process sequence integration is occurring where operation 952 lays down a first layer and operation 954 lays a second layer over the first layer. However, because of the ability to change masks and maintain vacuum conditions, the second site isolated deposition covers the entire first area and some additional area past the first area. In one embodiment, a blanket deposition operation may be performed in operation 954 as this operation would provide the insulating layer with spatial variation.

The method of FIG. 8 then advances to operation 956 where a third site isolated deposition is performed over the discrete region of the substrate without breaking vacuum. The third site isolated deposition covers a third area that is smaller than the second area, such that the third site isolated deposition is isolated from the first site isolated deposition by the second site isolated deposition. It should be appreciated that by maintaining vacuum the substrate is not exposed to any oxidation conditions and the processing occurs in the same system. The embodiment of FIG. 8 yields the structure of FIG. 5C in one embodiment. In this embodiment, there is isolation between the metal and insulator layers and isolation between the top and the bottom metal electrodes. It should be appreciated that testing of the materials and the process sequence may be performed between each of the method operations described above. It should be further appreciated that the order of operations discussed for FIG. 8 is not meant to be limiting. Consequently, a blanket step could be optional and even performed elsewhere, e.g., the blanket wafers may be purchased from a vendor. In addition, the blanket deposition processes can occur between any of the operations described above, which in turn enables another technique for providing an insulating layer with spatial variation. As mentioned above, the embodiment of FIG. 8 is exemplary and not meant to be limiting. In another embodiment, the configuration of two features across one layer is different.

Thus, the embodiments described herein provide for combinatorial wafer processing and site isolation processing with adjustable spatial definition across multiple layers without the need for a vacuum break to be introduced during the processing. The multiple masks and the ability to remove and replace the masks in a processing module or rotate the masks or wafers as described without exposing the process components to a deleterious environment, enables variation of spatial location and geometry across a sequence of processes of a substrate being processed. The elimination of the need for a vacuum break avoids oxidation, exposure to air, moisture, contamination or exposure to a non-clean or otherwise deleterious environment. The embodiments described above further enable in-situ variation of feature geometry and location across multiple layers of a substrate. Accordingly, variation over a process sequence may be tested as well as the materials and processes used for that sequence to more efficiently arrive at an optimum overall process sequence integration. The testing of the process sequence may occur in stages where a relatively large group of materials, processes and process sequence integration candidates are systematically narrowed to a relatively small group of materials, processes and process sequence integration candidates. The small group of materials, processes and process sequence integration candidates is then evaluated in a small scale processing environment, e.g., combinatorial processing of a single wafer while mimicking processing conditions on a large scale, to identify a relatively small group of best possible combinations of the materials, processes and process sequence integration candidates.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for combinatorially processing a substrate in a cluster tool, comprising method operations of:
   receiving the substrate;
   successively processing multiple layers within site-isolated regions of the substrate while spatially varying a mask between the successive processing of the multiple layers to vary a size relationship between the multiple layers, wherein spatially varying the mask between the successive processing comprises:
   processing the substrate in a chamber of the cluster tool with a first mask having a first feature set;
   removing the first mask having the first feature set from the chamber into a module of the duster tool;
   removing a second mask from the module into the chamber, wherein the removing the first mask and removing the second mask occurs without breaking vacuum within the chamber or the module;
   transitioning a shutter to extend into the chamber from a shutter garage coupled to the chamber, the shutter blocking a portion of the second mask; and
   processing the substrate in the chamber with the second mask having the second feature set.

2. The method of claim 1, wherein the module is decoupled from the chamber and wherein the module maintains vacuum when decoupled from the chamber.

3. The method of claim 1, wherein the first feature set and the second feature sets are different.

4. The method of claim 1, wherein the first feature set and the second feature sets are selected from the group consisting of an opening size, an opening shape, an opening orientation, an opening number, an opening location, and an opening distribution.

5. The method of claim 1, further comprising:
   storing the second mask having the second feature set inside the module under vacuum when processing the substrate in the chamber with the mask having the first feature set, wherein the module is decoupled from the chamber; and
   storing the first mask having the first feature set outside of the chamber when processing the substrate in the chamber with the mask having the second feature set.

6. The method of claim 1, wherein the method operation of successively processing multiple layers forms a functional structure.

7. The method of claim 6, further comprising a method operation of testing the functional structure in-situ.

\* \* \* \* \*